United States Patent [19]
Xiang et al.

[11] Patent Number: 6,146,907
[45] Date of Patent: Nov. 14, 2000

[54] METHOD OF FORMING A DIELECTRIC THIN FILM HAVING LOW LOSS COMPOSITION OF $BA_xSR_YCA_{1-X-Y}TIO_3$: $BA_{0.12-0.25}SR_{0.35-0.47}CA_{0.32-0.53}TIO_3$

[75] Inventors: Xiao-Dong Xiang, Alameda; Hauyee Chang, Berkeley; Ichiro Takeuchi, Albany, all of Calif.

[73] Assignee: The United States of America as represented by the United States Department of Energy, Washington, D.C.

[21] Appl. No.: 09/420,873

[22] Filed: Oct. 19, 1999

[51] Int. Cl.[7] .......................... H01L 21/00; C04B 35/46
[52] U.S. Cl. ................... 438/3; 501/134; 501/136
[58] Field of Search ................... 438/3; 501/134, 501/136, 137, 139, 152

[56] References Cited

U.S. PATENT DOCUMENTS

| | | | |
|---|---|---|---|
| 4,914,080 | 4/1990 | Yoshikawa et al. | 505/1 |
| 5,723,361 | 3/1998 | Azuma et al. | |
| 5,853,500 | 12/1998 | Joshi et al. | |
| 5,874,379 | 2/1999 | Joo et al. | |
| 5,889,299 | 3/1999 | Abe et al. | 257/295 |

FOREIGN PATENT DOCUMENTS

| | | |
|---|---|---|
| 02167858 | 6/1990 | Japan . |
| 04050164 | 2/1992 | Japan . |

OTHER PUBLICATIONS

Knauss, L.A., et al., "The Effect of Annealing on the Structure and Dielectric Properties of $Ba_xSr_{1-x}TiO_3$ Ferroelectric Thin Films," *Appl. Phys. Lett.* 69:(1), pp. 25–27 (Jul. 1996).

Bhattacharya, Pijush, et al., "Comparative Study of Amorphous and Crystalline (Ba, Sr)$TiO_3$ Thin Films Deposited by Laser Ablation," *Jpn. J. Appl. Phys.*vol. 32, pp. 4103–4106 (1993).

Durst, G., et al., "Solid Solubility Study of Barium, Strontium, and Calcium Titanates,"*Journal of the Amer. Ceramic Society*, vol. 33, No. 4, pp. 133–139 (Apr. 1950).

Mitsui, T. and Westphal, W.B., "Dielectric and X–Ray studies of $Ca_xBa_{1-x}TiO_3$ and $Ca_xSr_{1-x}TiO_3$, " *Physical Review*, vol. 124, No. 5, pp. 1354–1359 (Dec. 1, 1961).

Hanak, J.J., "The 'Multiple–Sample Concept' in Materials Research: Synthesis, Compositional Analysis and Testing of Entire Multicomponent Systems," *Jour. of Materials Science*, pp. 964–971 (1970).

Kingon, A.I., et al., "High–Permittivity Perovskite Thin Films for Dynamic Random–Access Memories," *MRS Bulletin*, pp. 46–51 (Jul. 1996).

Van Dover, R.B., et al., "Discovery of a Useful Thin–Film Dielectric Using a Composition–Spread Approach," *Nature*, vol. 392, pp. 162–164 (Mar. 1998).

Chang, H., et al., "A Low–Loss composition Region Identified From a Thin–Film composition Spread of $(Ba_{1-x-y}Sr_xCa_y)$ $TiO_3$," Amer. Institute fo Physics, vol. 74, No. 8, pp. 1165–1167 (Feb. 27, 1999).

*Primary Examiner*—Brian Dutton
*Assistant Examiner*—Brook Kebede
*Attorney, Agent, or Firm*—William C. Daubenspeck; William R. Moser; Paul A. Gottlieb

[57] ABSTRACT

A dielectric thin-film material for microwave applications, including use as a capacitor, the thin-film comprising a composition of barium strontium calcium and titanium of perovskite type $(Ba_xSr_yCa_{1-x-y})TiO_3$. Also provided is a method for making a dielectric thin film of that formula over a wide compositional range through a single deposition process.

16 Claims, 2 Drawing Sheets

(a)

(b)

(a)

(b)

METHOD OF FORMING A DIELECTRIC THIN FILM HAVING LOW LOSS COMPOSITION OF $BA_xSR_yCA_{1-x-y}TIO_3$: $BA_{0.12-0.25}SR_{0.35-0.47}CA_{0.32-0.53}TIO_3$

GOVERNMENT RIGHTS

The United States Government has a paid-up license in this invention pursuant to Contract No. DE-AC03-76SF00098 between the United States Department of Energy and the University of California for management of the Lawrence Berkeley National Laboratory.

BACKGROUND OF THE INVENTION

1. Field of the Invention (Technical Field)

The invention generally relates to dielectric thin-films belonging to the $Ba_xSr_yCa_{1-x-y}TiO_3$ class of perovskite oxide and fabrication methods thereof.

2. Background Art

Thin-film ferroelectric materials have application for various electronic devices, such as dynamic and ferroelectric random access memories ("DRAM" and "FRAM"). Thin-film ferroelectric materials are also widely used in the development of new microwave devices such as frequency agile filters, phase shifters, and tunable high-Q resonators as taught generally in L. A. Knauss, et. al., *Appl Phys. Lett.* 69:25–27 (1996) and P. Bhaftacharya, et. al., *Jpn. J. Appl Phys.*, 32:4103–4106 (1993).

The dielectric currently utilized in DRAMS and for microwave applications is $SiO_2$ or a silicon oxide/nitride composite layer ("ONO") with a relative dielectric constant of 6. However, as integrated circuit devices move toward higher and higher integration densities, severe demands are placed on the device design, particularly with respect to squeezing storing capacity into a smaller cell space. A capacitance of about 9 $fF/\mu M^2$ appears to be the maximum achievable value for ONO type of materials. As a result, since the mid-1980's, there has been an increasing effort to replace the ONO dielectric with an alternative dielectric having a substantially higher capacitance per unit area.

Most attention has been focused on $(Ba_xSr_{1-x})TiO_3$ ("BST"), as these materials possess high dielectric constants ($\epsilon_r$) and low loss (tan $\delta$). At room temperature, single crystal $SrTiO_3$ has a very low loss (tan $\delta<10^{-4}$) but also a low dielectric constant. On the other hand, $BaTiO_3$ has very high dielectric constants but high loss. Mixing Sr and Ba has resulted in BST materials with high dielectric constants and improved tan $\delta$ over $BaTiO_3$. BST is a ferroelectric with the perovskite structure. The BST solid solution also shifts the Curie point of $BaTiO_3$ at 130° C. to around room temperature for $Ba_{0.7}Sr_{0.3}TiO_3$, thus achieving the maximum permittivity around the operating temperature.

A method of making various elemental compositions of BST type materials is taught by Azuma, et.al., in U.S. Pat. No. 5,723,361. Azuma uses molecular precursors, preferably metal carboxylates or metal alkoxides dissolved in an organic solvent such as xylene. The thoroughly mixed solution is then coated on a substrate by a "spin-on" deposition process. Following each spin coat the solvent is removed by a low temperature drying process. The desired thickness of the final film thus depends upon the number of spin-dry cycles in the process. Although Azuma suggests the combination of the metal calcium with the core BST material the method of Alzuma requires the spin coating of a liquid metal precursor, preferably in the form of a metal carboxylate or alkoxide. Also, the traditional co-deposition method of Alzuma permits only one specific material composition to be made per deposition process. That is, the final stoichiometry of the BST type material is uniform throughout the deposited material, and is predetermined by the solution of mixed metal concentrations. In the present invention, the unique deposition process results in a BST type material that is non-uniform throughout the deposited material, and thus allows the testing of various metal compositions from a single deposition process.

SUMMARY OF THE INVENTION
(DISCLOSURE OF THE INVENTION)

The present invention is of a dielectric thin film comprising barium, strontium, calcium, titanium and oxygen of general formula $(Ba_cSr_yCa_{1-x-y})TiO_3$. In the preferred embodiment the thin film comprises the following mole fraction of Group IIA metals; barium is approximately about 0.12 to 0.25, strontium is approximately about 0.35 to 0.47, and calcium is approximately about 0.32 to 53. A dielectric thin film with such an elemental composition would typically have a dielectric constant between approximately 130 and 160 and tan $\delta$ of less than 0.02.

The present invention is also of a method of forming a dielectric thin film of general formula $(Ba_xSr_yCa_{1-x-y})TiO_3$ comprising: providing a substrate, depositing titanium dioxide, barium, strontium, and calcium on the substrate, and heating the substrate containing the deposited titanium dioxide, barium, strontium, and calcium. The depositing of titanium dioxide, barium, strontium, and calcium can be accomplished in a sequentially random order or concurrently. In the preferred embodiment, the titanium dioxide, barium, strontium, and calcium are deposited by pulse laser deposition.

The present invention is also of a method of forming a dielectric thin film of general formula $(Ba_xSr_yCa_{1-x-y})TiO_3$ comprising: providing a substrate, depositing $TiO_2$, $BaCO_3$, $SrCO_3$ and $CaCO_3$ on the substrate, and heating the substrate containing the deposited $TiO_2$, $BaCO_3$, $SrCO_3$ and $CaCO_3$. The depositing of $TiO_2$, $BaCO_3$, $SrCO_3$ and $CaCO_3$ can be accomplished in a sequentially random order or concurrently. In the preferred embodiment, the $TiO_2$, $BaCO_3$, $SrCO_3$ and $CaCO_3$ are deposited by pulse laser deposition. Following the deposition of the various carbonates the deposited film is heated between approximately about 200 and 500° C., preferably 400° C., for at least approximately 24 hours, followed by a heating step of approximately 500 and 800° C. for at least approximately 12 hours, preferably at 500, 600, 700 and 800° C. for at least approximately 3 hours at each temperature, and finally heating between approximately 900 and 950° C. for at least approximately four hours, preferably at 900 and 950° C. for at least approximately 2 hours at each temperature.

The present invention is also of a method of forming a dielectric thin film of general formula $(Ba_xSr_yCa_{1-x-y})TiO_3$ comprising: providing a triangular shaped substrate, depositing titanium dioxide, barium, strontium, and calcium, preferably $TiO_2$, $BaCO_3$, $SrCO_3$ and $CaCO_3$, on the triangular shaped substrate in a sequentially random order with a computer controlled shutter system, rotating the triangular shaped substrate 120° after each subsequent deposition, and heating the triangular shaped substrate containing the deposited titanium dioxide, barium, strontium, and calcium. In the preferred embodiment, the titanium dioxide, barium, strontium, and calcium, preferably $TiO_2$, $BaCO_3$, $SrCO_3$ and $CaCO_3$, are deposited by pulse laser deposition. Following the deposition of the various carbonates the deposited film is heated between approximately about 200 and 500° C., preferably 400° C., for at least approximately 24 hours, followed by a heating step of approximately 500 and 800° C. for at least approximately 12 hours, preferably at 500, 600, 700 and 800° C. for at least approximately 3 hours at each temperature, and finally heating between approximately 900 and 950° C. for at least approximately four hours, preferably at 900 and 950° C. for at least approximately 2 hours at each temperature.

The present invention is also of a dielectric thin film manufactured by the methods described above.

The present invention solves the problem of having to make numerous individually distinct compositional specimens by generating a compositional spread of compounds through a single deposition process. Thus, the invention provides the best way to rapidly survey a large range of select material compositions with optimal electronic or dielectric properties. To generate such a compositional spread, the desired metal precursors are deposited sequentially using a high precision computer controlled shutter. Following an annealing step this technique generates a precisely controlled stoichiometric profile within a very small area compared to the traditional co-deposition processes.

A primary object of the present invention is the method of making a thin-film, ferroelectric material of non-uniform composition, $Ba_xSr_yCa_{1-x-y}TiO_3$ ("BSCT") through a single deposition process. This process permits the testing of specific BST material compositions for low dielectric loss or leakage and an acceptable dielectric constant without the need to individually make each individual compositional specimen.

A further object of the present invention is to provide a thin-film BSCT with low dielectric loss or leakage and an acceptable dielectric constant, and having enhanced application, particularly for high-frequency or microwave applications, for uses such as DRAM, frequency agile filter, phase shifter, and tunable high-Q resonator devices.

A further object of the present invention is to provide a method for fabrication of thin-film BSCT with low dielectric loss or leakage, and an acceptable dielectric constant.

A primary advantage of the invention is to provide a method to make a wide compositional range of dielectric BST type materials that have low loss (tan $\delta$) and high dielectric constants through a single combinatorial deposition process rather than the need to fabricate each novel material composition separately.

Another advantage of the present invention is that the low dielectric loss or leakage of thin-film BSCT allows for higher integration densities. This in turn permits the manufacture of smaller devices, including memory devices such as DRAM devices, and devices such as frequency agile filters, phase shifters, and tunable high-Q resonators.

Yet another advantage of the present invention is that the low dielectric loss or leakage of thin-film BSCT permit the manufacture of devices with a lower power consumption requirement, including memory devices such as DRAM devices, and devices such as frequency agile filters, phase shifters, and tunable high-Q resonators.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

In the integrated circuit art, an acceptable crystalline material is often referred to as a "substrate." Throughout the specification and claims, the term "substrate" defines any specified layer or crystal structure, and most generally refers to any support for another layer. This may include any of a variety of silicon crystals, and may also include $LaAlO_3$ and MgO substrates, among others. The term "BSCT" includes materials of the general form $(Ba_xSr_yCa_{1-x-y})TiO_3$.

The crystalline BSCT composition of the invention preferably has a perovskite type structure as will be understood by those skilled in the art. These BSCT materials are classified as ferroelectrics, and typically exhibit ferroelectricity at room temperature. The invented materials typically have high dielectric constants and relatively low dielectric losses, and are useful as high dielectric constant capacitors, whether or not they exhibit ferroelectric properties at normal operating temperatures.

In a material having the form $(Ba_xSr_yCa_{1-x-y})TiO_3$, the ratio of Ba to Sr to Ca is variable but the total number of Ba, Sr, and Ca atoms is fixed with respect to Ti atoms and O atoms. This ratio is expressed generally as $(Ba_xSr_yCa_{1-x-y})TiO_3$ indicating that the total of Ba, Sr and Ca atoms equals one (x+y+1−x−y=1) combined with one Ti atom and three O atoms. As a result, the amounts of each Group IIA cation stated in a particular compositional mixture is in terms of atomic or mole fractions of the total number of atoms or moles of Group IIA metal cations.

While the preferred method of depositing Group IIA metal precursors is by pulsed laser deposition, any means for depositing Group IIA metal precursors known to the art may be employed, such as sputtering, chemical vapor deposition CVD, and metallorganic CVD. In one preferred embodiment, a compositional spread of $BaCO_3$, $SrCO_3$, and $CaCO_3$ is layered at room temperature with a pulsed laser deposition system equipped with an in situ shutter system, as shown schematically in FIG. 1a. The shutter is computer controlled and moves parallel to the surface of the triangular substrate during the course of a deposition at various and predetermined rates to give a linear thickness gradient (or arbitrary linear profile) of the layered carbonate precursors. This technique generates precisely controlled compositional profiles within a very small area. Post annealing of the layered carbonate materials results in high quality epitaxial BSCT films.

Figure 1:
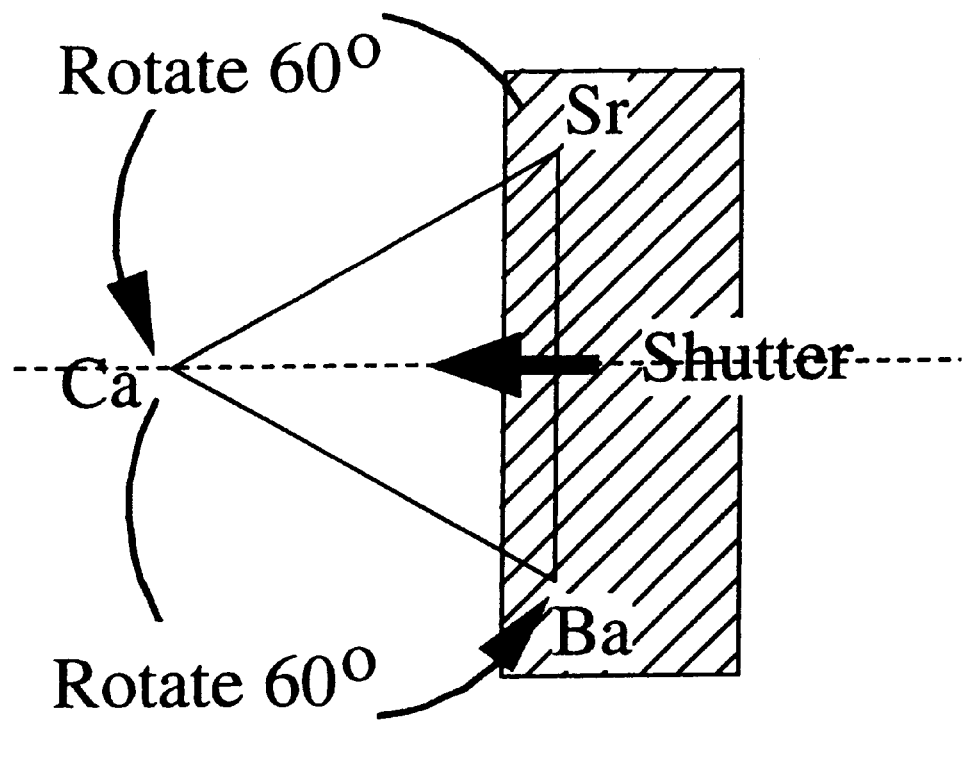
FIG. 1a is a schematic of a deposition system with a computer-controlled shutter used to generate a linear gradient of precursors, the shutter being placed about 20 microns above the substrate on which films are deposited.
FIG. 1b is a profile of resultant pre-annealed precursor layers of $CaCO_3$, $SrCO_3$, and $BaCO_3$ (viewed edge on and with respect to FIG. 1a)
Figure 1:
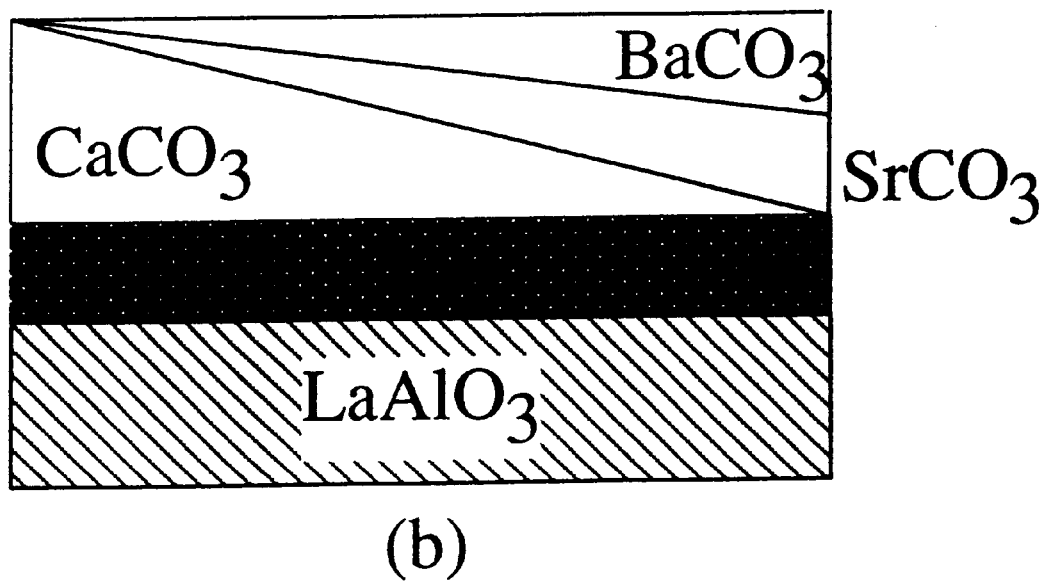
Figure 2:
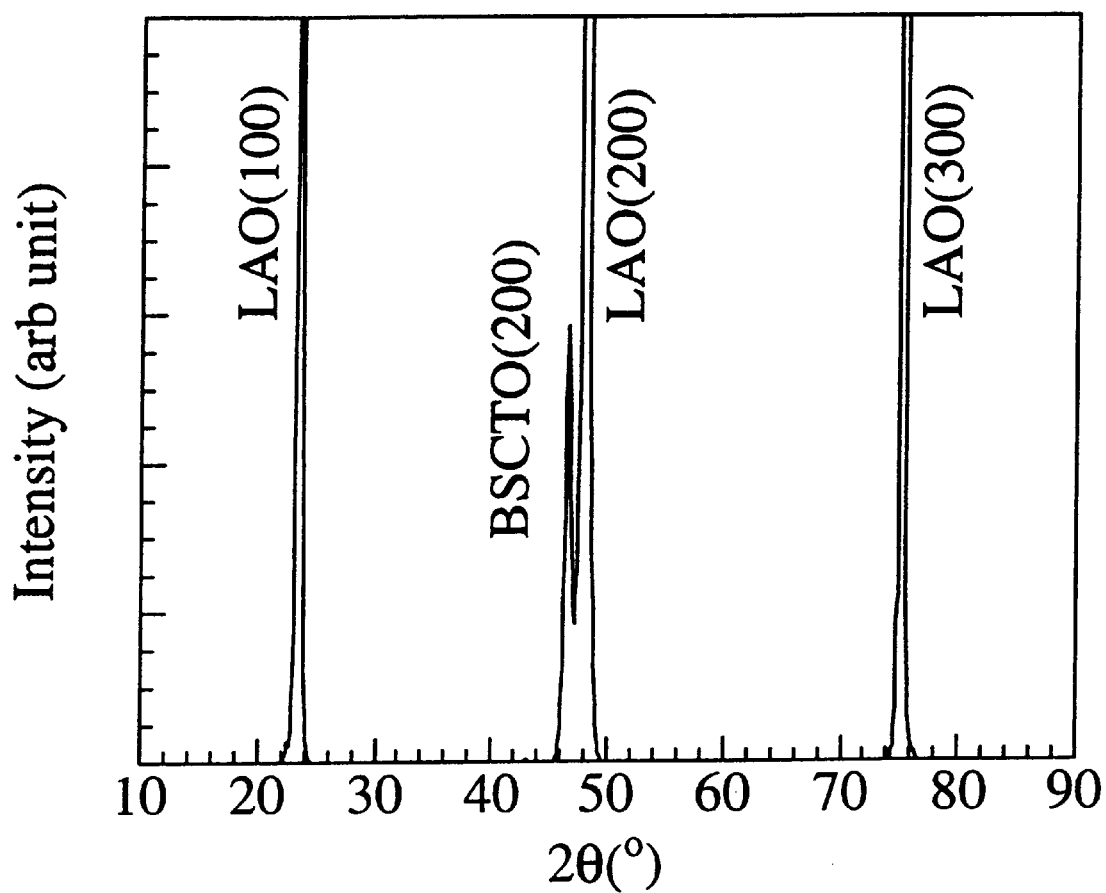
FIG. 2 is the $\Theta/2\Theta$ XRD pattern of a $Ba_{0.2}Sr_{0.4}Ca_{0.4}Ti$ synthesized from layers of $BaCO_3$, $SrCO_3$, $CaCO_3$ and $TiO_2$ on (001) $LaAlO_3$.

Fabrication of the thin-film ferroelectric BSCT materials, begins with the deposition of $TiO_2$ to a uniform, suitable thickness, such as 750 Å, on a triangular, single-crystal $LaAlO_3$ substrate. High vacuum pulsed laser deposition coupled with scanning of laser beam across Group IIA targets results in the layering of the Group IIA carbonates onto the $TiO_2$ layer. Alternatively, a thin-film BSCT can be formed using a plurality of concurrently sputtered Group IIA and Ti targets. Moving the shutter during the deposition as illustrated in FIG. 1a generated a linear thickness gradient of $CaCO_3$. Gradients of $SrCO_3$ and $BaCO_3$ were then deposited in the same way by rotation of the substrate 120°. The resultant thin film profile along the dotted line of the triangular substrate in FIG. 1a is shown in FIG. 1b.

It is preferred to first anneal the layered carbonate film at temperatures of 200 to 500° C., preferably 400° C., for at least 24 hours to allow homogeneous mixing of precursors into an amorphous intermediate before crystallization at higher temperatures. Also, because the carbonates are moisture sensitive it is preferred to maintain a temperature of at least 200° C. during the time period between deposition of the carbonates and the annealing process. Following the 24 hour anneal period, the substrate containing the deposited titanium dioxide, barium, strontium, and calcium is preferably heated between approximately 500 to 800° C. for at least 12 hours, preferably at approximately 500, 600, 700 and 800° C. for 3 hours at each temperature. The substrate containing the deposited titanium dioxide, barium, strontium, and calcium is further heated between approximately 900 and 950° C. for about 4 hours, preferably at approximately 900 and 950° C. for about 2 hours at each temperature. This procedure allows one to synthesize thin films of all compositions with the composition spread of $Ba_xSr_yCa_{1-x-y}TiO_3$.

The microwave dielectric properties of the BSCT material at 1 GHz was analyzed with a scanning Evanescent Microwave Microscope (SEMM). Compositions of $Ba_{0.12-0.25}Sr_{0.35-0.47}Ca_{0.32-0.53}TiO_3$ had the lowest tan $\delta$ and are the best candidates for microwave dielectric applications. These films have tan $\delta$ less than 0.02 and $\delta_r$'s values between 130–160.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of forming a dielectric thin film of general formula $(Ba_xSr_yCa_{1-x-y})TiO_3$ the method comprising the steps of:
   a) providing a substrate;
   b) depositing titanium dioxide, barium, strontium, and calcium on the substrate; and
   c) heating the substrate containing the deposited titanium dioxide, barium, strontium, and calcium.

2. The method of claim 1, wherein the depositing step comprises depositing titanium dioxide, barium, strontium, and calcium in a sequentially random order.

3. The method of claim 1, wherein the depositing step comprises depositing titanium dioxide, barium, strontium, and calcium concurrently.

4. The method of claim 1, wherein the depositing step comprises depositing titanium dioxide, barium, strontium, and calcium by pulse laser deposition.

5. A method of forming a dielectric thin film of general formula $(Ba_xSr_yCa_{1-x-y})TiO_3$ the method comprising the steps of:
   a) providing a substrate;
   b) depositing $TiO_2$, $BaCO_3$, $SrCO_3$ and $CaCO_3$ on the substrate; and
   c) heating the substrate containing the deposited $TiO_2$, $BaCO_3$, $SrCO_3$ and $CaCO_3$.

6. The method of claim 5, wherein the depositing step comprises depositing $TiO_2$, $BaCO_3$, $SrCO_3$ and $CaCO_3$ in a sequentially random order.

7. The method of claim 5, wherein the depositing step comprises depositing $TiO_2$, $BaCO_3$, $SrCO_3$ and $CaCO_3$ concurrently.

8. The method of claim 5, wherein the depositing step comprises depositing $TiO_2$, $BaCO_3$, $SrCO_3$ and $CaCO_3$ by pulse laser deposition.

9. The method of claim 5 wherein the heating step comprises the steps of:
   heating the substrate between approximately 200 and 500° C. for at least approximately 24 hours;
   heating the substrate between approximately 500 and 800° C. for at least approximately 12 hours; and
   heating the substrate between approximately 900 and 950° C. for at least approximately 4 hours.

10. The method of claim 5 wherein the heating step comprises the steps of:
    heating the substrate at approximately 400° C. for at least approximately 24 hours;
    heating the substrate at approximately 500, 600, 700 and 800° C. for at least approximately 3 hours at each temperature; and
    heating the substrate at approximately 900 and 950° C. for at least approximately 2 hours at each temperature.

11. A method of forming a dielectric thin film of general formula $(Ba_xSr_yCa_{1-x-y})TiO_3$ the method comprising the steps of:
    a) providing a triangular shaped substrate;
    b) depositing titanium dioxide, barium, strontium, and calcium on the triangular shaped substrate in a sequentially random order with a computer controlled shutter system;
    c) rotating the triangular shaped substrate 120° after each subsequent deposition; and
    d) heating the triangular shaped substrate containing the deposited titanium dioxide, barium, strontium, and calcium.

12. The method of claim 11, wherein the depositing step comprises depositing titanium dioxide, barium, strontium, and calcium by pulse laser deposition.

13. A method of forming a dielectric thin film of general formula $(Ba_xSr_yCa_{1-x-y})TiO_3$ the method comprising the steps of:
    a) providing a triangular shaped substrate;
    b) depositing $TiO_2$, $BaCO_3$, $SrCO_3$ and $CaCO_3$ on the triangular shaped substrate in a sequentially random order with a computer controlled shutter system;

c) rotating the triangular shaped substrate 120° after each subsequent deposition; and d) heating the triangular shaped substrate containing the deposited $TiO_2$, $BaCO_3$, $SrCO_3$ and $CaCO_3$.

14. The method of claim 13, wherein the depositing step comprises depositing $TiO_2$, $BaCO_3$, $SrCO_3$ and $CaCO_3$ by a pulse laser deposition system.

15. The method of claim 13 wherein the heating step comprises the steps of:

heating the substrate between approximately 200 and 500° C. for at least approximately 24 hours;

heating the substrate between approximately 500 and 800° C. for at least approximately 12 hours;

heating the substrate between approximately 900 and 950° C. for at least approximately 4 hours.

16. The method of claim 13 wherein the heating step comprises the steps of:

heating the substrate at approximately 400° C. for at least approximately 24 hours;

heating the substrate at approximately 500, 600, 700 and 800° C. for at least approximately 3 hours at each temperature;

heating the substrate at approximately 900 and 950° C. for at least approximately 2 hours at each temperature.

* * * * *